United States Patent [19]

Sauer

[11] E Re. 31,612

[45] Reissued Jun. 26, 1984

[54] CCD INPUT CIRCUITS

[75] Inventor: Donald J. Sauer, Plainsboro, N.J.

[73] Assignee: RCA Corporation, New York, N.Y.

[21] Appl. No.: 269,520

[22] Filed: Jun. 1, 1981

Related U.S. Patent Documents

Reissue of:

[64] Patent No.: 4,139,784
Issued: Feb. 13, 1979
Appl. No.: 821,318
Filed: Aug. 2, 1977

[51] Int. Cl.³ ..... G11C 19/28; H01L 29/78; H03K 3/42

[52] U.S. Cl. ..... 307/221 D; 307/311; 357/24

[58] Field of Search ..... 307/221 D, 311; 357/24 R, 24 M, 24 LR

[56] References Cited

U.S. PATENT DOCUMENTS

| | | | |
|---|---|---|---|
| 3,660,697 | 5/1972 | Berglund et al. | 357/24 |
| 3,758,794 | 9/1973 | Kosonocky | 357/24 |
| 3,858,232 | 12/1974 | Boyle et al. | 357/24 |
| 3,986,198 | 10/1976 | Kosonocky | 357/24 |
| 4,040,077 | 8/1977 | Tehon | 357/24 |
| 4,071,775 | 1/1978 | Hewes | 357/24 |
| 4,262,217 | 4/1981 | Levine | 357/24 M |

OTHER PUBLICATIONS

Kosonocky et al., "Basic Concepts of Charge-Coupled Devices" RCA Review, vol. 36 (9/75), pp. 566-593.

Hense et al., "Linear Charge-Coupled Signal-Processing Techniques" IEEE J. Solid-State Circuits, vol. SC-11 (2/76), pp. 197-202.

Erb et al., "An Overloading Electrode Buried Channel CCD" IEEE Int. Electron Devices Meeting (12/73), Tech. Digest, pp. 25-26.

*Primary Examiner*—Gene M. Munson

*Attorney, Agent, or Firm*—Joseph S. Tripoli; George J. Seligsohn

[57] ABSTRACT

The circuits include a floating diffusion, a source supplying a controllable amount of charge to the floating diffusion and a charge coupled device (CCD) reference register for periodically removing a fixed amount of charge from the floating diffusion. A feedback circuit senses the average voltage at the floating diffusion and adjusts the controllable amount of charge supplied to the diffusion to maintain its average voltage-level constant. The feedback circuit may be employed automatically to control the direct voltage bias at the input electrode of a DDC signal register. It may alternatively be employed to control a radiation source serving as the input to the system, or to operate a circuit for indicating the frequency at which the reference CCD register is being driven, or as an input to a current mirror amplifier.

29 Claims, 18 Drawing Figures

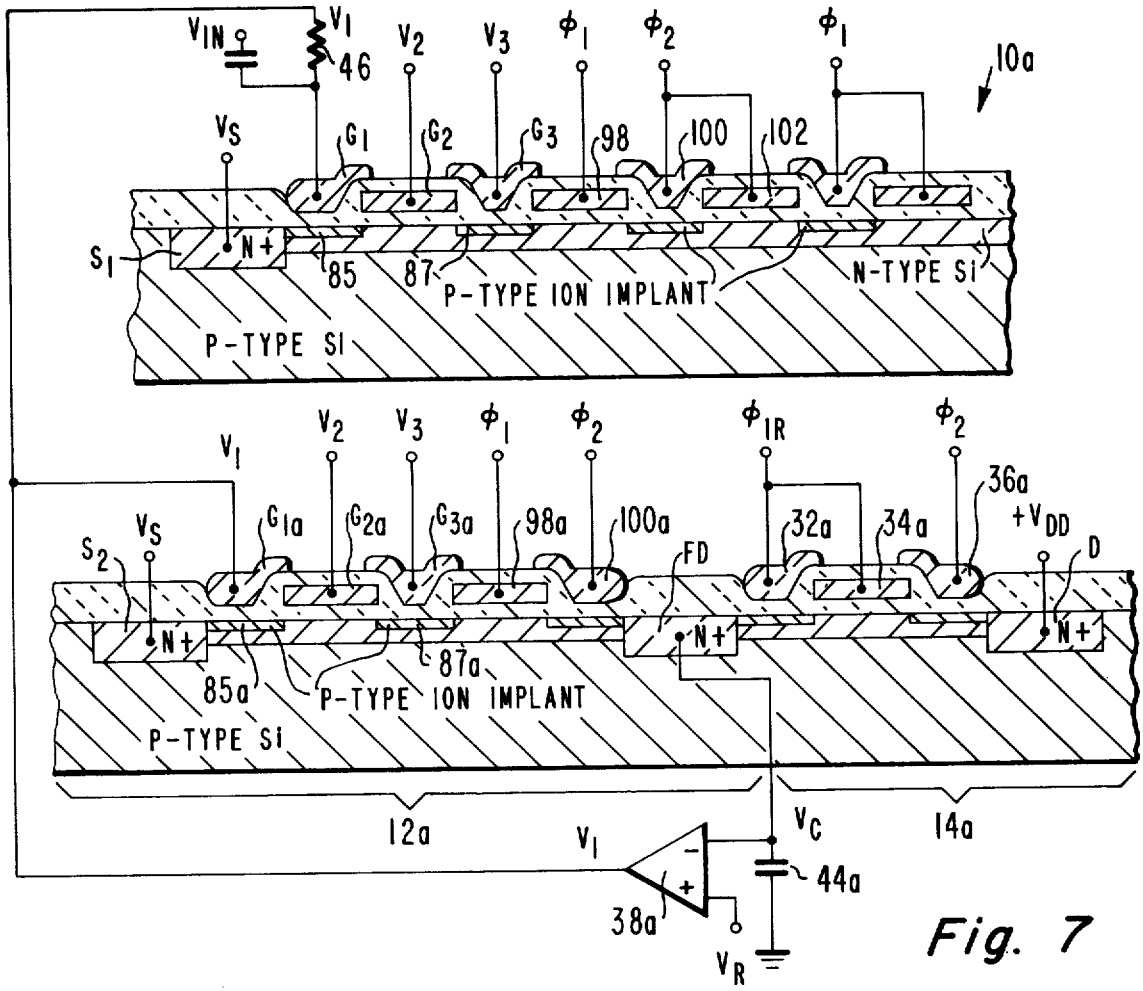
Fig. 7
Fig. 8
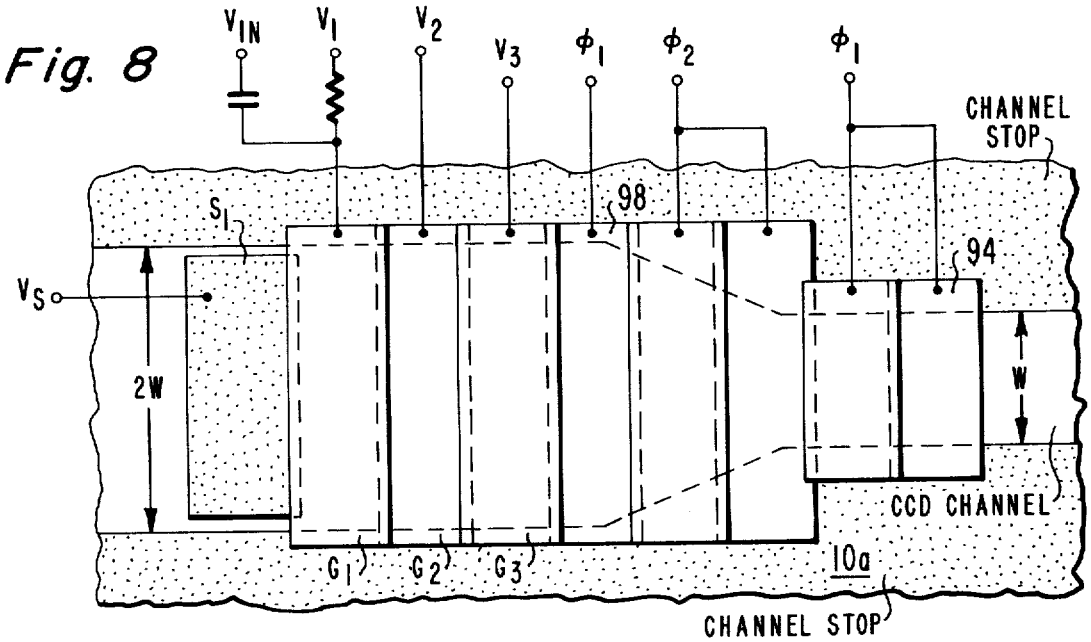

CCD INPUT CIRCUITS

Matter enclosed in heavy brackets [ ] appears in the original patent but forms no part of this reissue specification; matter printed in italics indicates the additions made by reissue.

The present invention relates to charge coupled devices (CCD's).

CCD's have found numerous uses in signal processing applications. The input signal to the CCD, in many of these applications, comprises an analog signal which can vary in either sense relative to a reference voltage level. This requires that the input electrode to the CCD be DC biased at a level such that when the input signal is at the reference level—say 0 volts, a given amount of charge which may be termed a "bias charge" will be shifted into the first potential well. Biased in this way, any variation in the input signal in one sense from the reference level will result in a greater amount of charge being shifted into the first potential well and vice versa.

For an AC coupled signal with symmetrical swings (such as a sine wave), the optimum value for the "bias charge" is one half of the full well capacity in the CCD signal register. At this bias point the dynamic range of the input signal charge is maximum because the bias charge is centered between the limits of saturation (full well) and cutoff (empty well) in the CCD register.

In the case of more complex asymmetrical analog signals, such as the video signals employed in television, it is generally desirable to employ a DC restoring circuit (i.e. a clamping circuit) at the input to the CCD rather than a simple AC coupled input circuit in order to reduce the dynamic range required in the CCD to handle the maximum peak-to-peak input signal voltage. For example, in the case of a television composite video signal, the average level of the signal relative to the peak of the sync pulses varies with picture content. This is illustrated in FIGS. 11a and 11b which show the wide variation in average level which may occur in two different scenes. If an AC coupled input circuit were employed for this form of signal, nearly twice the dynamic range would be required to handle a given peak-to-peak video input voltage as would be needed with a DC restored input circuit. With the latter, the optimum "bias charge" in the CCD register can be close to a full well or close to an empty well, depending on the polarity of the clamping circuit employed.

The signal processing circuits described above normally are integrated and it is desirable, in the interest of economy and for other reasons, that the CCD and its associated circuits such as clock drivers, amplifiers and so on, be on the same chip. However, up to now, so far as is known, adjustment of the DC bias voltage discussed above has required an off chip adjusting circuit such as a potentiometer or the like. In high volume commercial applications, the need for such an adjustment is highly undesirable because of the cost of the external circuit and the cost for making the initial adjustment, and because of possible subsequent problems relating to drift and aging which may necessitate readjustment of the bias voltage level at some future date.

A circuit embodying one form of the present invention includes means for automatically controlling the DC bias level discussed above. The adjusting circuit may be on the same chip as the CCD and its associated circuits. The circuit includes an electrically floating region in the substrate to which a controllable amount of charge is applied and from which a fixed amount of charge is periodically removed. The average voltage level of the floating region is sensed and employed to control the amount of charge supplied to the floating region, for making it equal to the amount of charge removed from the floating region, and to control also the direct voltage bias level applied to an input electrode of the CCD signal register. Other embodiments of the invention are discussed in detail below.

In the drawing:

FIG. 7 is a section through another CCD system embodying the invention;

FIG. 8 is a plan view of a portion of the system of FIG. 7;

Similar reference characters are employed to identify similar parts in the various figures.

Figure 1:
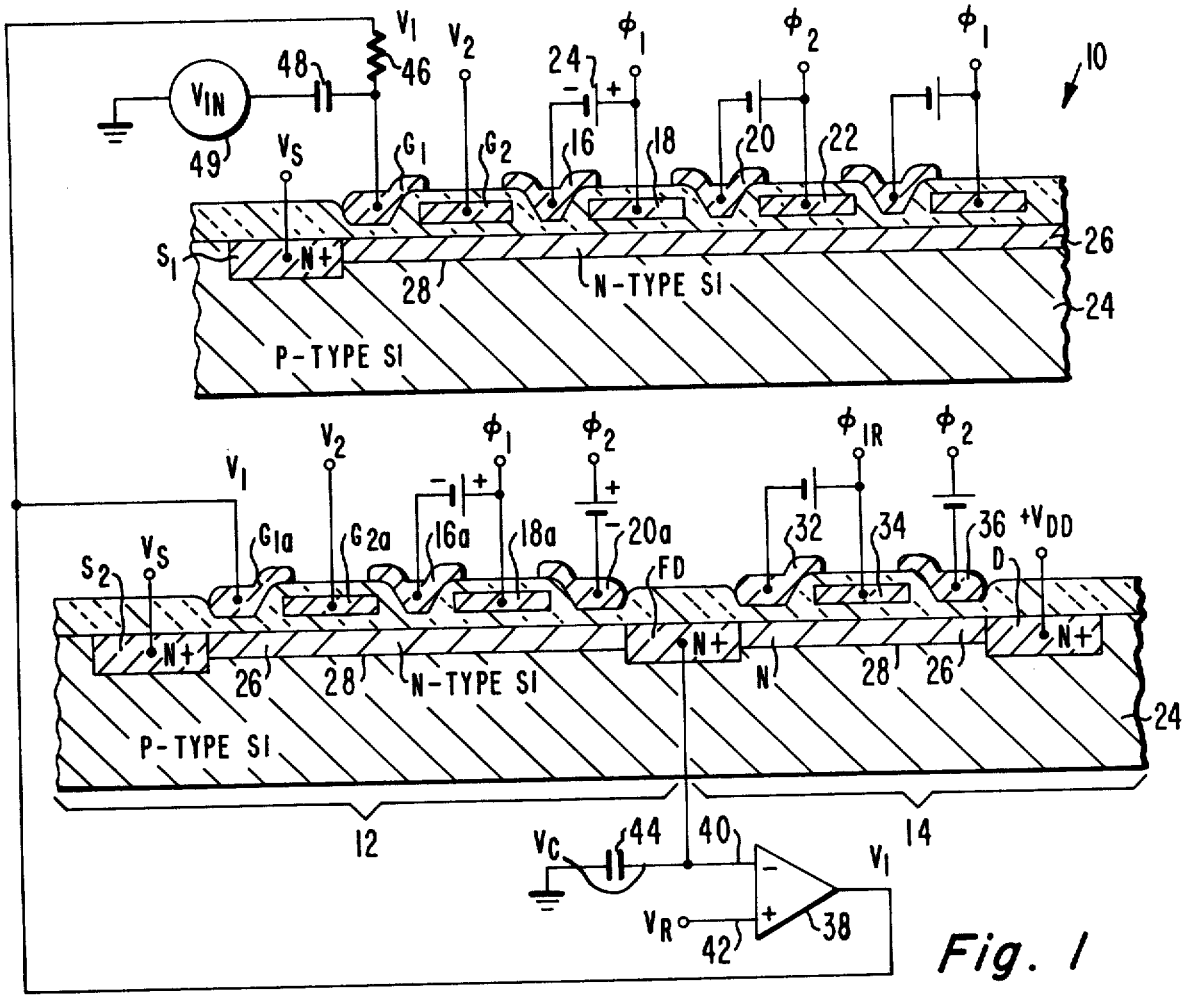
FIG. 1 is a section through a CCD system embodying the invention.

Referring first to FIG. 1, the CCD system illustrated includes a CCD signal register 10, a first CCD reference register 12 and a second CCD reference register 14. Each of these registers is shown by way of example to comprise a two-phase, buried-channel device employing two-level polysilicon gate electrodes. It is to be understood, of course, that this is intended as an example only as the CCD's can be either of the surface or the buried channel type and can have P or N substrates and can be operated by any practical number of phases. Further, other electrode structures such as single layer or triple layer may be employed, and metal rather than polysilicon electrodes or combinations of metal and polysilicon electrodes may be employed.

The signal register 10 and the first reference register 12 include "fill and spill" input circuits of the type described in U.S. Pat. No. 3,986,198, issued Oct. 12, 1976 to Walter F. Kosonocky. In the signal register 10 this circuit includes a source electrode $S_1$ which comprises an N+ diffusion in a P-type silicon substrate, a first gate electrode $G_1$ and a second gate electrode $G_2$. Here and in the other figures, two overlapping layers of electrodes are employed and these electrodes are spaced the same distance (such as 1,000Å) from the substrate by an insulating layer such as one formed of silicon dioxide.

The electrodes $G_1$ and $G_2$ are followed by the multiple phase electrodes 16, 18; 20, 22; and so on. Electrodes 16 and 18 comprise a set of phase 1 ($\phi_1$) electrodes, with electrode 18 the same distance from the substrate as electrode 16 and always at a more positive potential than electrode 16. The means for offsetting the voltage of electrode 18 relative to 16 is illustrated schematically as a battery 24. As is well understood in the art, the electrode pair 16, 18 operated in this way creates in asymmetrical potential well in the substrate for permitting unidirectional charge propagation. The electrode pair 20, 22 is similar to the pair 16, 18 but is operated by the phase 2 voltage $\phi_2$ rather than the phase 1 voltage. Of course other means for creating asymmetrical wells (such as self-aligned ion implanted barriers, as shown in FIG. 7) may be employed in systems embodying the invention.

The first reference register 12 is substantially identical to the first portion of the signal register 10 and the various electrodes are identified by the same reference numerals followed by a. As already mentioned, these two registers as well as the second reference register 14 comprise buried channel CCD's which include a P-type silicon substrate 24 and a very thin N-type silicon layer 26 at the surface of the P-type substrate. A P-N junction 28 is present between the substrate 24 and N-type layer 26. All of the structure shown in FIG. 1 may be integrated on a common substrate 24.

The output circuit of the first reference register 12, which is also part of the input circuit of the second reference register 14, includes a floating N+ diffusion FD. It is followed by electrode pair 32, 34 which is driven by a phase 1 reference voltage $\phi_{1R}$. This electrode pair is followed by a phase 2 electrode 36 and the latter is followed by an N+ drain diffusion D. The drain diffusion is connected to a source of positive voltage $+V_{DD}$.

The system also includes a feedback circuit comprising a differential amplifier 38 which may be integrated and which is connected at its inverting input terminal 40 to the floating diffusion and at its non-inverting input terminal 42 to a source of reference voltage $V_R$. An integrating capacitor 44 is connected between the inverting input terminal and a point of reference voltage such as ground. In many applications this capacitor may be a MOS capacitor (the capacitance between the underlying semiconductor and a gate electrode which overlaps at one edge an edge of an N+ diffusion and which is also over an induced inversion layer under the gate electrode in a P-type substrate as one example) or other form of integrated capacitor structure which may be integrated into the same chip as the remaining elements of the system. The output terminal of the differential amplifier connects to the first electrode $G_{1a}$ of the first reference register 12 and connects through resistor 46 to the first electrode $G_1$ of the signal register 10. The input signal $V_{IN}$, which may be an analog signal, is also applied to the first gate electrode $G_1$ through capacitor 48. The resistor 46 serves to isolate the signal source 49 from the differential amplifier 38 and from the first reference register 12.

Figure 3:
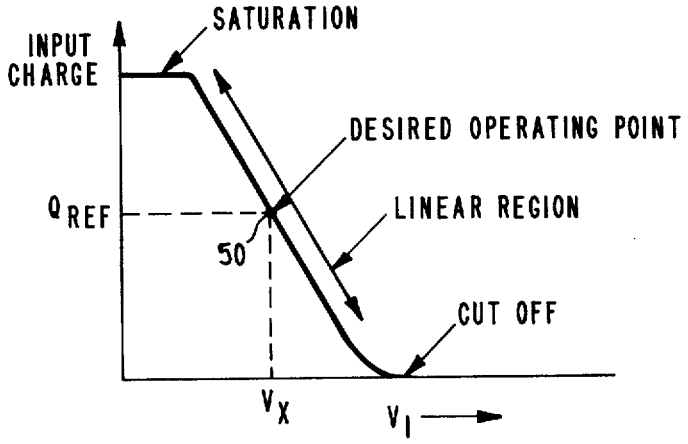
FIG. 3 is a graph of the voltage applied to the first CCD electrode versus input charge level in the CCD signal register of FIG. 1.

FIG. 3 illustrates, in a general way, the input characteristic of the signal register 10. $V_1$ is the DC bias level applied to the first gate electrode $G_1$. It may be observed that as the voltage $V_1$ becomes more positive, less charge becomes stored in the fill and spill potential well (the potential well beneath electrode $G_2$). This will be discussed in more detail later. It is desired that $V_1$ be set to some predetermined level such as $V_x$ and remain at substantially that level during quiescent operation. If it is assumed that the input signal $V_{IN}$ is an analog signal which is symmetrical, then it is desired that $V_x$ be at a value such that the CCD operates at the center of its linear region. This corresponds to the point 50 in FIG. 3, and 50 may correspond to a charge which will fill the potential well beneath electrode 18 to ½ its capacity.

The circuit just described permits this type of operation. Indeed, it permits the operating point 50 to be placed anywhere desired along the characteristic of FIG. 3. In the example just described of a symmetrical input signal, the operating point 50 may correspond to a bias charge which half fills the well beneath electrode 18 (or may correspond to a bias charge at some other level depending upon what portion of the characteristic is linear and where the linear region is located, that is, where it is desired that $V_x$ be). For some other form of signal, such as an asymmetrical signal, the desired operating point may be placed closer to the saturation or to cut-off, depending upon the sense of the asymmetry of the input signal relative to the reference base line of the signal and also on the particular shape of the characteristic. For the asymmetrical composite video of FIGS. 11a and 11b, placing the operating point close to one end of the linear range of FIG. 3 substantially reduces the dynamic range required to handle the peak video signal. Where the signal of FIGS. 11a and 11b simply AC coupled to the CCD, the dynamic range required to handle both signals would be $|\Delta V_1|+|\Delta V_2|\approx 2\Delta V_{PEAK}$. However, if the signal is clamped to the most negative level—that of the sync pulse, the dynamic range needed is only $\Delta V_{PEAK}$.

Figure 2:
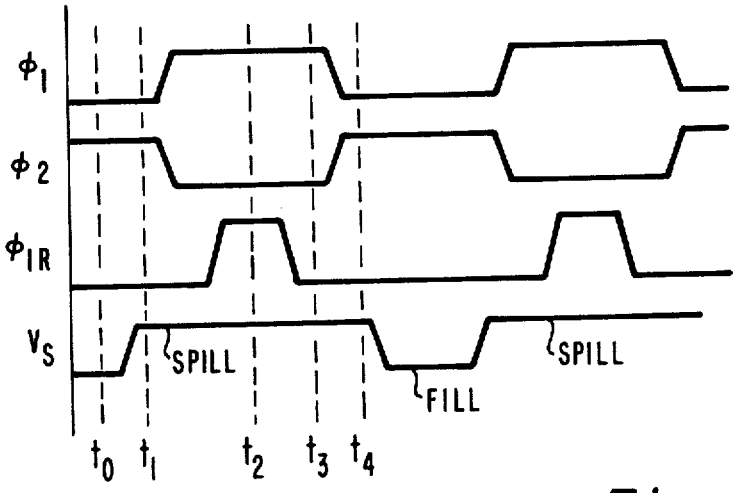
FIG. 2 is a drawing of waveforms which are employed in the operation of the system of FIG. 1.
Figure 5:
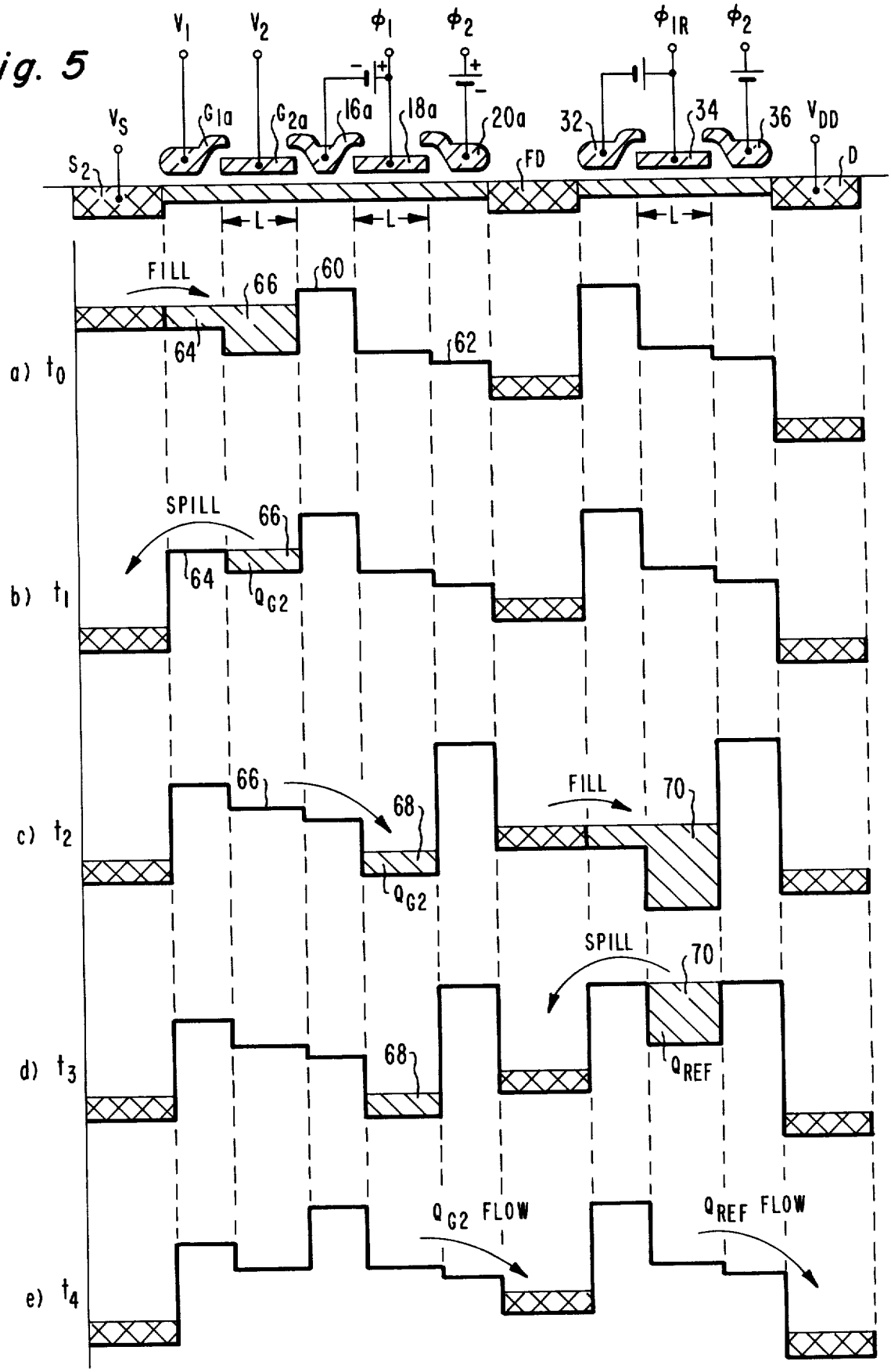
FIG. 5 is a drawing of surface potential profiles to help explain the operation of a portion of the system of FIG. 1.

The operation of the circuit may be better understood by considering FIGS. 1, 2 and 5. FIG. 2 shows the operating voltages. The two-phase voltages $\phi_1$ and $\phi_2$ are symmetrical. $V_S$ is the voltage applied to the source electrodes $S_1$ and $S_2$ and $\phi_{1R}$ is the reference clock voltage which is in phase with $\phi_1$ but is of greater amplitude than $\phi_1$ and which is applied to the electrode pair 32, 34. These waves are intended as examples only. Alternatives are possible. For example, the present invention is equally applicable to CCD's which employ so-called "push-clock" or "drop-clock" operating waveforms.

At time $t_0$, $\phi_1$ is low and $\phi_2$ is high. Accordingly, there is a potential barrier 60 beneath electrode 16a of the first reference register of FIG. 5 and a potential well 62 beneath phase 2 electrode 20a. $V_S$ is relatively negative so that the diffusion $S_2$ acts as a source of charge (electrons) and this charge flows over the potential barrier 64 beneath the first electrode $G_{1a}$ and into the potential well 66 beneath electrode $G_{2a}$. This is the "fill" portion of the "fill and spill" cycle. At time $t_1$, the voltage $V_S$ applied to the diffusion $S_2$ has changed from a relatively negative to a relatively positive value. The diffusion $S_2$ now operates as a drain. The charge in excess in potential well 66 flows over the barrier 64 and into the diffusion $S_2$.

The charge remaining in potential well 66 in identified as $Q_{G2}$. It should be clear from this figure that the height of barrier 64 determines the amount of bias charge $Q_{G2}$. As the barrier height increases ($V_1$ less positive), $Q_{G2}$ increases and vice versa.

At time $t_2$, $\phi_1$ has gone high and $\phi_2$ has gone low and also $\phi_{1R}$ has gone high. Note that $\phi_{1R}$ is more positive than $\phi_1$. As $\phi_1$ is high, the charge $Q_{G2}$ formerly in well 66 has shifted to the potential well 68 beneath phase 1 electrode 18a. Assume for purpose of the present explanation that at a previous time corresponding to $t_4$ (to be discussed shortly), charge had been shifted into the floating diffusion FD. The amount of this charge would have depended on the bias voltage level $V_1$ applied to the first electrode $G_{1a}$. At time $t_2$, when $\phi_{1R}$ is high, charge (electrons) in the floating diffusion has passed into the potential well 70 beneath electrode 34. This filling is part of a fill and spill process as will soon become apparent.

At time $t_3$, $\phi_{1R}$ has returned to its low value, reducing the depth of potential well 70. The excess charge in this well has spilled back into the floating diffusion FD, as shown in substrate potential profile d of FIG. 5. Thus, what has just been described is the net removal of a fixed amount of charge $Q_{REF}$ from the floating diffusion FD. In the embodiment illustrated, the potential beneath electrode 32 at time $t_3$ is equal to that beneath electrode 36 at time $t_3$. One might wonder if in this case some charge prematurely spills from well 70 into the drain D. However tests have shown that by the time the surface potential beneath electrode 32 reaches the same level as that beneath electrode 36 essentially all of the charge which should "spill" already has left well 70 and passed into floating diffusion FD with essentially none remaining to pass over the equal height barrier beneath electrode 36. Proper operation is further assured by proper choice of the slope of the lagging edge (high-to-low transition) of the $\phi_{1R}$ wave. It is also possible to choose the offset voltage between electrodes 32 and 34 to be such that the height of the barrier beneath electrode 32 at time $t_3$ is lower than that beneath electrode 36.

At time $t_4$, the charge in potential well 68 has flowed into the floating diffusion FD as $\phi_2$ is now relatively positive and $\phi_1$ relatively negative. Also, the reference charge $Q_{REF}$ previously removed has been shifted to the drain D.

Referring now to FIG. 1, the capacitor 44 connected to the floating diffusion integrates the net charge which is present at this floating diffusion. If the charge $Q_{REF}$ removed from FD is the same as the charge $Q_{G2}$ received by FD, the voltage $V_c$ across capacitor 44 remains constant; if $Q_{REF}>Q_{G2}$ the voltage $V_c$ becomes more positive (actually less negative); if $Q_{REF}<Q_{G2}$ the voltage $V_c$ becomes more negative.

The voltage range of $V_c$ over which the circuit will operate properly is quite wide, in one particular design about 6 volts or so. This range is a function of the relative amplitudes of $\phi_{1R}$ and $\phi_2$, as will be shown. $V_c$ must be within a range such that the floating diffusion FD acts as a drain for reference register 12 and simultaneously acts as a source for the fill and spill input of reference register 14. Referring to FIG. 5, the range of $V_c$ is between (1) the potential barrier under gate 18a when $\phi_1$ is at its most negative level and (2) the potential barrier under gate 32 when $\phi_{1R}$ is at its most positive level.

The purpose of the negative feedback circuit comprising differential amplifier 38 is to shift the DC level at $V_c$ to a DC level at $V_1$ compatible with the input stage used, and to provide a signal inversion from $V_c$ to $V_1$ for the negative feedback. The performance characteristics needed for this differential amplifier are not at all critical. For example, in a typical design a voltage gain of 5 to 10 is adequate and an input offset voltage up to 0.5 volt would not adversely affect circuit operation. The circuit for producing $V_R$ produces a value of $V_R$ which initially is near the center of the $V_c$ range so that some drift in $V_R$ may be tolerated. When the negative feedback circuit reaches steady state, the voltage $V_c$ across the capacitor is nearly equal to $V_R$ (minus any input offset voltage in the differential amplifier) and $V_1$ reaches a constant value. This constant value is such that the next charge packet which is measured and is subsequently shifted to the floating diffusion will exactly equal the fixed amount of charge $Q_{REF}$ which has been removed from the floating diffusion. Assume, for example, that the fixed amount of charge $Q_{REF}$ is exactly equal to ½ of the charge capacity of the well 68 beneath electrode 18a. Then when $V_1$, the feedback voltage, achieves a stable value, the charge $Q_{G2}$ which periodically is shifted to the well 68, will fill well 68 to exactly ½ of its capacity. This same voltage $V_1$ is fed back to the gate electrode $G_1$ in the signal register 10. Accordingly, in the absence of input signal $V_{IN}$, the bias charge periodically shifted between the phase 1 electrode 18 will also equal ½ the capacity of well 18. It is assumed here, of course, that the CCD signal register 10 is substantially identical to the first CCD reference register 12 in all respects including electrode dimensions, channel oxide thickness, channel width and so on. All of this, of course, is feasible when all devices are integrated onto the same substrate.

Assume now that the amount of charge removed from the floating diffusion FD exceeds the amount of charge which is shifted to the floating diffusion. In other words, more electrons are removed from the floating diffusion than are added thereto. This results in the average voltage across the capacitor going more positive. This, in turn, causes the output voltage $V_1$ of the differential amplifier to go more negative. This results in a raising of the potential barrier 64 so that upon the completion of the next spill cycle (time $t_1$, FIG. 5) there will be more charge $Q_{G2}$ present in well 66. This increased charge subsequently is shifted to the floating diffusion FD. This process continues until a point is reached at which the charge entering the floating diffusion will equal the charge removed from the floating diffusion at which time the average voltage $V_C$ across the capacitor will equal $V_R$ and the voltage $V_1$ then will stabilize at a fixed level (the level $V_x$ of FIG. 3).

Suppose now that there is less charge removed from the floating diffusion by the second reference register 14 than is supplied to the floating diffusion by the first reference register 12. This makes the floating diffusion more negative (more electrons received than are removed) so that the average voltage $V_C$ across capacitor 44 becomes more negative. This makes the output voltage $V_1$ of the differential amplifier more positive and this lowers the potential barrier 64. This, in turn, reduces the amount of charge stored in well 66 during the next fill and spill period and which subsequently is shifted by the first reference register 12 to the floating diffusion. Again the negative feedback circuit is such as to stabilize the voltage $V_1$ at the level $V_x$ of FIG. 3 such that the desired amount of charge reaches the floating diffusion. This automatically controls the voltage applied to the first gate electrode $G_1$ of the signal register 10.

In the previous discussion it is stated that $V_R$ can be within a certain range. Any variation of $V_R$ within this range does not result in the shifting of the position $V_x$ (FIG. 3). So long as $V_R$ remains within its range, at equilibrium $V_C$ will be close to $V_R$ and $V_1$ will be at the constant value for which the circuit has been designed and at which $Q_{G2}=Q_{REF}$.

Figure 6:
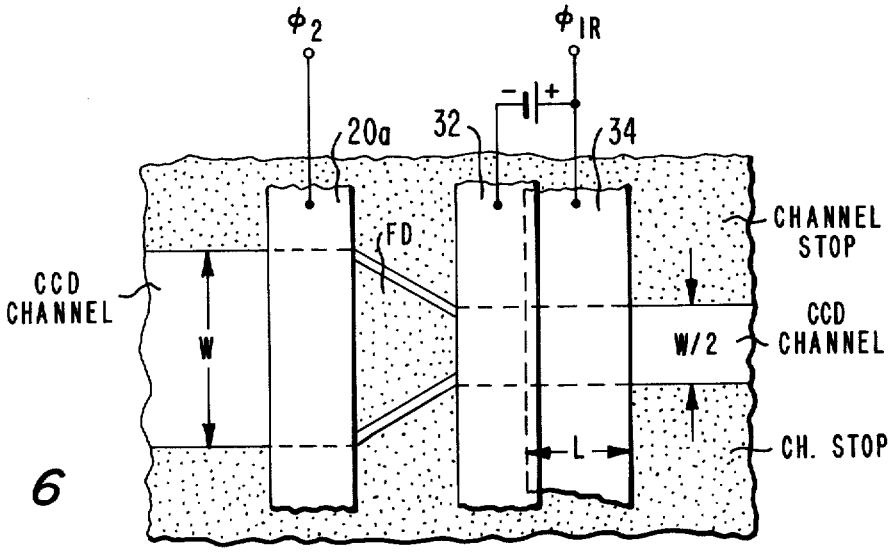
FIG. 6 is a plan view of a portion of the system of FIG. 1.

The feedback voltage $V_1$ in the present system always adjusts the bias component of charge $Q_{G2}$ to be exactly equal to $Q_{REF}$. Therefore, to achieve a desired bias level $V_1$, the system is designed to make the size of the well 70 (at time $t_3$) some desired fraction of the maximum capacity of the wells beneath multiple phase electrodes in the signal register such as electrode 18. It is assumed here that the well beneath electrode $G_{2a}$ is equal in size to the well beneath the electrode $G_2$ of the CCD signal register 10. The approach illustrated in FIG. 6 for making the well 70 a fraction of the size of the well beneath electrode 18, is to reduce the CCD channel width while maintaining the electrode 34 length L the same as that of the corresponding previous electrodes (see also FIG. 5). In the interest of obtaining high speed charge propagation, the length L of all electrodes generally is made as small as the photolithographic techniques used in the manufacture of the CCD will permit. Therefore, it generally is not possible to decrease the size of a potential well by decreasing L. However, the channel width readily can be decreased. In the example given, where it is desired that the potential well 70 at time $t_3$ be one half the maximum possible size of a potential well beneath electrode 18, the channel width in the second CCD reference register 14 is made one half that in the first CCD reference register 12 as shown in FIG. 6.

There are alternative structures available for controlling the size of the potential wells in the second CCD reference register 14. One is to shift the charge from the diffusion FD into two diverging CCD channels. These two channels can have geometries (widths) such that the charge splits in any desired proportion, such as 50% into each channel (for the case of equal channel widths and equal electrode lengths) or in any other desired ratio. The charge in one of these channels may then be returned (shifted back) to the floating diffusion FD and the charge in the other channel removed by shifting it to a drain. In this case the charge which is removed to the drain is $Q_{REF}$.

It would also be possible to change the size of the potential well beneath electrode 34 by controlling the offset voltage between electrodes 32 and 34 at time $t_3$. In other words, the offset voltage between electrodes 32 and 34 would have to be made different than that between the $\phi_1$ electrode pairs. However, this is generally less convenient than controlling the well capacity by changing the electrode area.

Figure 4:
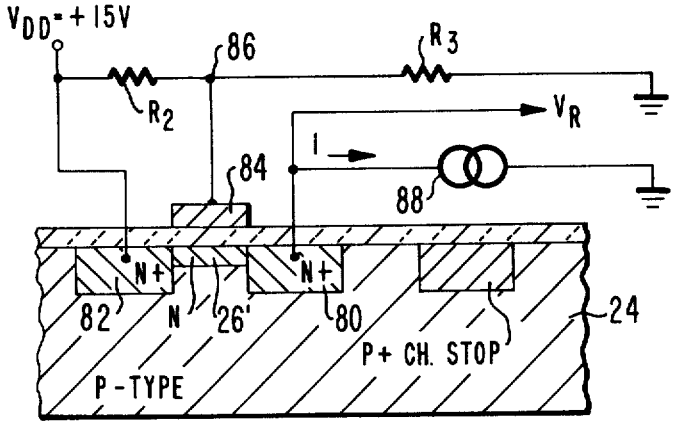
FIG. 4 is a schematic showing of a circuit for producing a reference voltage $V_R$ such as is employed in FIG. 1.

There are a number of circuits available for producing the reference voltage $V_R$. One convenient on-chip circuit for performing this function is illustrated in FIG. 4. It comprises a buried channel depletion mode transistor which includes a source electrode 80, a drain electrode 82 and a gate electrode 84. The source and drain electrodes comprise N+ diffusions in the substrate and the conduction channel of the transistor includes the buried channel 26' which is comparable to the buried channel of the CCD. This buried channel is N-type silicon over the P-type silicon substrate 24. A source of operating voltage $V_{DD}$ connects to the drain electrode. A voltage divider $R_2$, $R_3$ is connected between the drain electrode 82 and a point at a reference potential (such as the most negative part of $\phi_1$), shown as ground, and the gate electrode 84 connects to the tap 86 of the voltage divider. A current source 88 such as a resistor or a field effect transistor connected to operate as a load, connects between the source electrode 80 and ground.

In operation, the voltage divider comprising $R_2$ and $R_3$ is designed so that node 86, which is connected to the gate electrode of the buried channel transistor, is biased to about +3V. The transistor is operated in its saturation region and is biased about 0.5V into conduction beyond its threshold voltage $V_T$ by the relatively low current source 88. This sets the source diffusion 80 to a voltage $V_R$ which is $+3V-0.5=2.5V$ more positive than the buried channel potential minimum under the storage gate electrode 18a when $\phi_1$ is at ground potential (its lowest value) as shown in FIGS. 2 and 5 at time $t_0$. This places $V_R$ near the middle of its allowable operating range.

Figure 12:
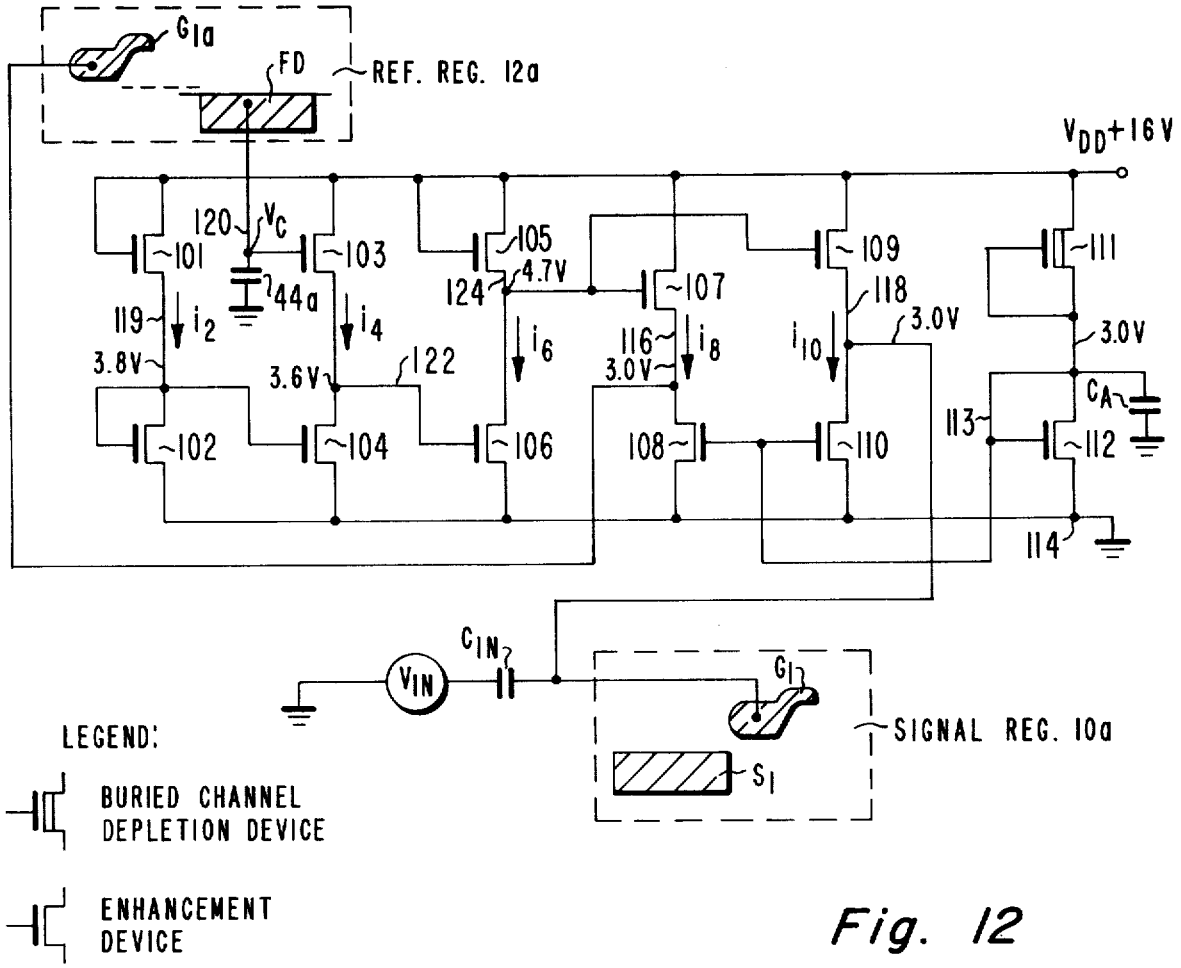
FIG. 12 is a circuit diagram of another form of feedback circuit that may be used in a CCD system embodying the invention.

While in the circuit of FIG. 1 the negative feedback circuit is shown to include a differential amplifier, other forms of feedback circuits may be used instead. As one example, the feedback circuit may comprise a voltage level shifter for translating the average voltage of the floating diffusion FD to a second voltage level which is compatible with the level required by the electrode $G_1$, which is substantially different from the voltage at FD, and without requiring the voltage gain of a differential amplifier. A circuit of this kind is illustrated in FIG. 12 and discussed later.

Copending U.S. application Ser. No. 758,184 for "Linear CCD Input Circuit" filed Jan. 10, 1977 by J. E. Carnes, P. A. Levine and D. J. Sauer (the present inventor) and assigned to the same assignee as the present application, discusses the transfer function of the input circuit to a buried channel CCD. This input circuit is shown to have a characteristic which is relatively nonlinear at low input signal levels and which is linear at higher input signal levels. In certain applications, for example in CCD delay lines employed to delay analog signals such as the video signals of television, this type of input characteristic is highly disadvantageous as signals at relatively low levels become distorted. It is desirable in such applications that the input transfer function be as linear as possible.

The CCD signal register 10a shown at the top of FIG. 7 and shown in plan view in FIG. 8, operates on the same principle as the CCD register described in the above-identified application. However, in the FIG. 7 system, the CCD structure is somewhat different than that of the copending application. The FIG. 7 system utilizes self-aligned barrier implants such as 85 and 87 under the second layer gate electrodes in order to obtain an asymmetrical potential well in the substrate for permitting unidirectional charge propagation with two phase clocking. Typical processing parameters for a buried N-channel CCD with this structure are: (1) Substrate: P-type 30–50 Ω-cm resistivity; (2) N-type buried layers implant: Phosphorous, Dose$=1.3\times10^{12}/cm^2$, Energy$=150$ keV, junction depth $X_j=0.75$ micron; (3) P-type barrier implant: Boron, Dose$=4\times10^{11}/cm^2$, Energy 100 keV. As in the register of the copending application, the CCD 10a includes electrodes $G_1$, $G_2$ and $G_3$ before the first multiple phase electrode. These electrodes are operated in such a way that a fixed charge level $Q_F$ (FIG. 10) always remains stored in the potential well beneath electrode $G_2$. This fixed charge level acts as a bias on the input transfer characteristic of the CCD to make the circuit operate only in the linear region of its characteristic. Superimposed over this fixed charge level $Q_F$ is an additional charge which comprises a bias plus signal charge $Q_{(B+S)}$. This additional charge subsequently is "skimmed" from the potential well beneath electrode $G_2$ and transmitted down the CCD register. The CCD channel subsequently is tapered down in width by an amount such that the maximum bias plus signal charge $Q_{(B+S)}$ will fill the first potential well in the narrower channel region.

Figure 9:
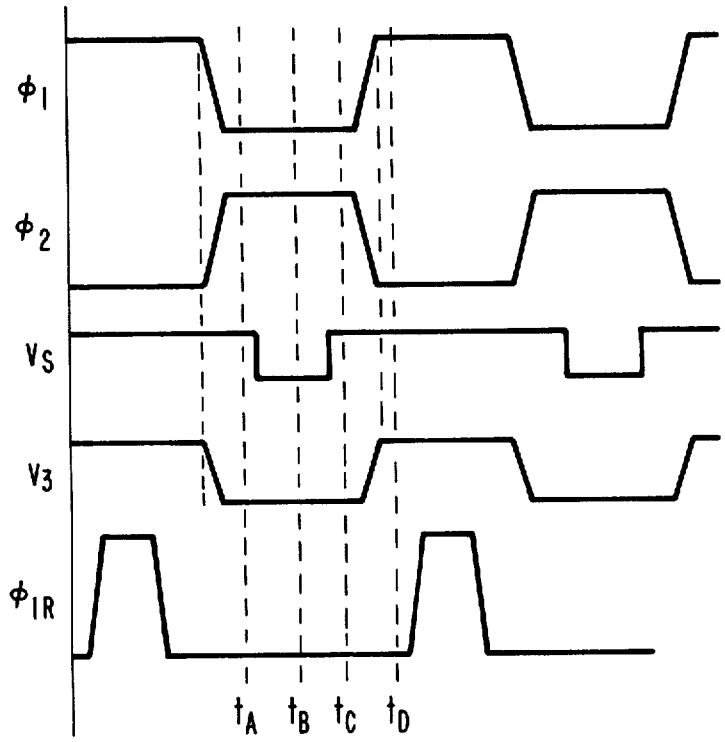
FIG. 9 is a drawing of waveforms employed in the operation of the system of FIGS. 7 and 8.
Figure 10:
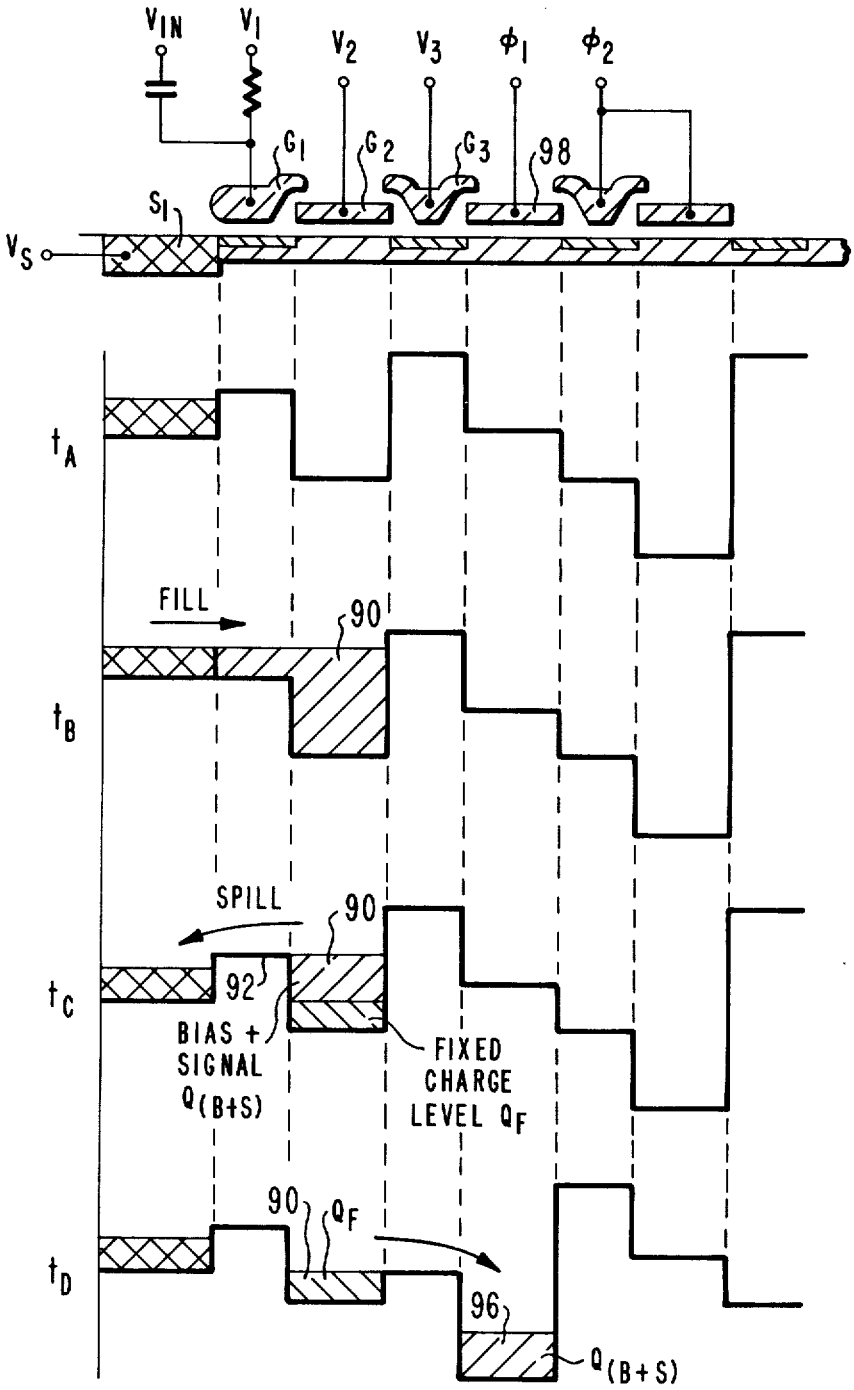
FIG. 10 is a drawing of surface potential profiles to help explain the operation of the system of FIGS. 7 and 8.

The operation above is depicted in the substrate potential profiles of FIG. 10 when considered in connection with the operating waveforms of FIG. 9. At time $t_B$, the voltage $V_S$ applied to diffusion $S_1$, causes this diffusion to operate as a source of charge carriers (electrons) and these flow into the potential well 90 beneath electrode $G_2$. At time $t_C$, the voltage $V_S$ is at a more positive level sufficiently so to cause the diffusion $S_1$ to operate as a drain and excess charge spills from the potential well 90 back into the diffusion $S_1$. There remains in potential well 90 a fixed charge level $Q_F$ and a bias plus signal charge $Q_{(B+S)}$. This bias plus signal charge includes a direct voltage component whose value is dependent on the voltage $V_1$ applied to gate electrode $G_1$. That is, this bias component is dependent on the level of potential barrier 92 in the absence of input signal. In the case of a symmetrical input signal $V_{IN}$, the voltage $V_1$ will establish a potential barrier 92 such that the bias component of the charge $Q_{(B+S)}$ will be at the center of the linear region of the input characteristic. This may correspond, for example, to ½ the capacity of the potential well beneath electrode 94 in the main portion of the CCD channel, that is, the narrowed down portion of the CCD channel as shown in FIG. 8. For an asymmetrical input signal, the voltage $V_1$ can be made to cause an operating point close to either end of the linear region of the input characteristic of the CCD depending upon the direction of asymmetry of the input signal.

At time $t_D$, when the voltage $V_3$ applied to the gate electrode $G_3$ is at its most positive value and when $\phi_1$ is also at its most positive value, the charge $Q_{(B+S)}$ has transferred from well 90 to the potential well 96 now present beneath the first phase 1 electrode 98. In other words, this charge $Q_{(B+S)}$ has been skimmed from the potential well 90, leaving behind the fixed charge level $Q_F$. The charge $Q_{(B+S)}$ subsequently is propagated down the CCD in conventional fashion.

The technique already described may be employed to control the $V_1$ level to make the bias component $Q_B$ of the charge $Q_{(B+S)}$ at any level desired. The complete system is shown in FIG. 7. It includes a first CCD reference register 12a which is comparable to register 12 of FIG. 1 but which now is substantially identical to the input portion of the CCD signal register 10a. In other words, its electrodes which are identified by the same characters as the electrodes of register 10a but followed by an a, are substantially identical in construction and dimensions to the electrodes of register 10a. In other respects, the registers 12a and 14a function in the same way as the corresponding registers 12 and 14 of FIG. 1. The capacitor 44a integrates the charge level on the floating diffusion FD and the differential amplifier 38a operates in the same way as the differential amplifier 38 of FIG. 1. The circuit automatically regulates the voltage $V_1$ to a fixed value by controlling the amount of charge $Q_B$ which is shifted to the floating diffusion FD to be precisely equal to the fixed amount of charge $Q_{REF}$ which is removed from the floating diffusion by the second CCD reference register 14a. Under these conditions, $V_C$ becomes substantially equal to $V_R$ and the circuit stabilizes.

As in the case of FIG. 1, feedback circuits other than specific ones illustrated may be employed for performing the regulating function, that is, for adjusting $V_1$ to a level such that the charge shifted to the floating diffusion FD is equal to the charge removed from the floating diffusion. Under this set of conditions, of course, the voltage $V_1$ applied through resistor 46 to the first gate electrode $G_1$ is at the desired, automatically regulated value.

In the two embodiments of the invention discussed herein, fill and spill input circuits are employed. It is to be understood that these are intended as examples only. The inventive teachings are applicable also to other conventional CCD inputs. For example, they are applicable to CCD's using the so-called current input method in which there is an input source diffusion which is maintained at a fixed potential, a first gate electrode which receives a gating pulse during each cycle of operation and a second gate electrode which receives both a DC bias voltage and an AC signal which is capacitively coupled to this second gate electrode. The DC bias applied to the second electrode may be controlled by a technique similar to that discussed herein; however, the feedback circuit should not include a signal inversion as previously shown. For example, the inverting and noninverting inputs of the differential amplifier may be interchanged to provide proper negative feedback required in this case.

The invention also is applicable to a CCD input circuit using the so-called voltage input method in which the source electrode receives the input signal, the first gate electrode receives a gating pulse during each clock cycle and the second gate electrode receives a DC voltage and acts as the input storage well. Here the feedback voltage is applied to the source diffusion through a signal isolating resistor and the AC signal is capacitively coupled to the source. In this case, the feedback circuit may be the same as that illustrated for the first two embodiments of the invention except that $V_1$ controls the DC bias voltage on the source diffusion.

In the various embodiments of the invention which have been discussed, charge is shifted to the floating diffusion FD during spaced first time intervals and is removed from the floating diffusion during spaced second time intervals interleaved with the first time intervals. However, as the integrating capacitor holds the floating diffusion voltage nearly constant during any one operating cycle, it is possible to operate the circuit in a different way. Thus, it is possible to remove the $Q_{REF}$ charge from the floating diffusion concurrently with the delivery of the $Q_{G2}$ charge to the floating diffusion. For operation in this way, a voltage $\phi_{2R}$ would be applied to the electrode pair 32, 34 (FIG. 1) or 32a, 34a (FIG. 7) where $\phi_{2R}$ bears a similar relationship to $\phi_2$ that $\phi_{1R}$ bears to $\phi_1$. In this case, of course $\phi_1$ would replace $\phi_2$ as the drive voltage for electrode 36 or 36a.

Figure 11A:
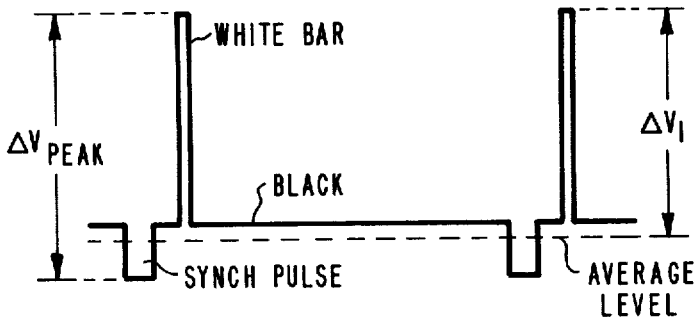
FIGS. 11a and 11b are drawing of composite television video signals for two different scenes.
Figure 11B:
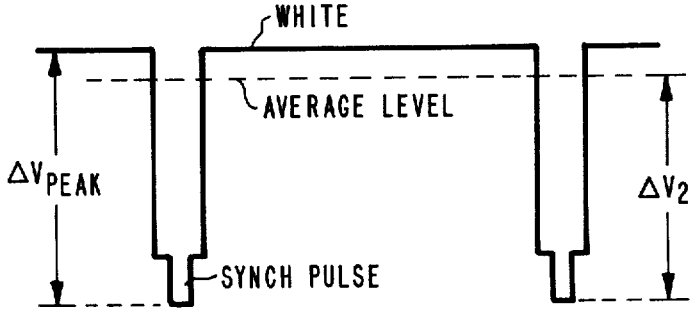

It has been mentioned previously that one may employ for the feedback circuit of a CCD system embodying the invention a level shifter rather than a differential amplifier. A suitable level shifter circuit is illustrated in FIG. 12. It is shown interconnected in a system such as that of FIG. 7 with the voltages chosen to be suitable for a composite video signal such as shown in FIGS. 11a and 11b. This level shifting feedback circuit includes also a circuit for clamping the video signal to the level of the most negative-going sync pulses.

The circuit of FIG. 12 includes a current mirror amplifier formed of enchancement mode MOS transistors 102 and 104 and having enhancement mode MOS transistors 101 and 103 as loads for the current mirror amplifier. Transistors 105 and 106 following the current mirror comprise an inverting amplifier stage. Transistors 107 and 109 following the inverting amplifier, comprise clamps. Transistor 108, 110 and 112 together comprise a second current mirror amplifier with diode-connected input transistor 112 receiving the input current to the mirror, with terminal 114 forming the common terminal of the mirror and with nodes 116 and 118 comprising output terminals of the mirror. The current mirror transistors 108 and 110 serve as current sources for the clamping transistors 107 and 109, respectively. Transistor 111 serves as a current source for the input transistor 112 of the current mirror. A depletion mode device is employed for transistor 111 as it provides a more constant current source than would an enhancement device.

In operation, the gate electrode of transistor 103 connects to the floating diffusion FD and to the integrating capacitor 44a. It receives a voltage which is dependent upon the average charge stored in the integrating capacitor 44a. The transfer function from node 120 at which the voltage $V_c$ appears, to the node 124 is inverting, with a typical gain of about 3. If the voltage $V_c$ at node 120 is equal to the voltage $V_{DD}$, which in this example is chosen to be +16 volts, then both nodes 119 and 122 will be at the same voltage level which is approximately +3.7 volts. This voltage level is a function of $\sqrt{K_{101}/K_{102}}$, where $K_{101}$=channel width/channel length of transistor 101, and $K_{102}$ is the same parameter for transistor 102.

In operation, the current $i_4$ flowing in the drain of transistor 104 mirrors the current $i_2$ flowing in the drain of transistor 102. Transistor 103 acts as a source follower and transistor 104 serves as a current source. The voltage at node 122 follows changes in $V_c$ with a typical gain of 0.8. The signal at node 122 is further amplified by the MOS transistor 106 which has a "ratioed" load transistor 105. The gain of this inverting amplifier is typically 3.8. Thus the overall voltage gain from node 120 to node 124 is about 3. In the example illustrated in FIG. 12 where $V_c$=15.6 volts, which is within the operating range for $V_c$, the voltage at node 116 will be +3.0 volts. The operating range for $V_c$ typically may be between 11 and 20 volts or so and is consistent with a fan and skim type of input in which electrode $G_3$ of FIG. 7 is pulsed from ground to +3 volts.

The geometries of the transistors forming current mirror 108, 110, 112 are such that transistors 108 and 110 act as low current sources for clamping transistors 107 and 109, respectively. In the example illustrated, transistor 111 supplies a current of 0.1 ma (milliamperes) to the input transistor 112 of the current mirror and the current $i_8$ and $i_{10}$ drawn by current sources 106 and 108, respectively, are 0.01 ma. (Typical geometries for the transistors of FIG. 12 are given later.) The actual value of the currents $i_8$ and $i_{10}$ is not critical. The value of the current affects the input resistance seen by the input signal $V_{IN}$. This input resistance should be greater than 100 kilohms so that the value of the input coupling capacitance $C_{IN}$ between the signal source and the gate $G_1$ of the signal register 10a, does not have to be too large while still being able to pass the lowest frequency video information of interest.

The clamping voltage developed at node 116 at the output of clamping transistor 107, is supplied to the gate electrode $G_{1a}$ of the reference register 12a. It places a bias voltage +3 volts on the gate electrode $G_{1a}$ of the reference register 12a which is equal to the 3 volts bias supplied by clamping transistor 109 to the gate electrode $G_1$ of the signal register 10a in the absence of input signal, that is, when $V_{IN}=0$. The clamping level is referenced to the voltage at node 124. In the example illustrated, this level is +4.7 volts and it may be assumed that the threshold voltage $V_T$ of enchancement type transistor 105 is 1.7 volts. As the gate electrode of transistor 107 is clamped to 4.7 volts, its source electrode (at node 114) is clamped to 4.7 volts$-V_T$=3 volts.

The clamping transistor 109 clamps the gate electrode $G_1$ at the same level +3 volts as transistor 107 clamps gate electrode $G_{1a}$. This value corresponds to the voltage level at the most negative-going portion of the sync pulses of FIG. 11. With the gate $G_1$ biased in this way, the size of electrode 34a of FIG. 7 should be such that the charge $Q_{REF}$ removed from the floating diffusion is close to a full well of charge. In other words, the bias portion $Q_B$ of the charge in potential well 90 of FIG. 10 should occupy almost the remainder of the full well above the fixed charge level $Q_F$ or in terms of FIG. 3, the operating point 50 is close to the saturation region of the characteristic. The reason is that the signal content comprises positive swings relative to the clamping level and as previously pointed out, a positive signal swing lowers the amount of charge in the well 90. In brief, as the gate electrode $G_1$ becomes more positive, the barrier 92 (FIG. 10) becomes lower and the amount of charge which remains in well 90 upon the completion of the spill process, becomes lower.

There is a capacitor $C_A$ between the common gate connection 113 of the mirror 108, 110, 112 and circuit ground. Its purpose is to act as a high frequency bypass for preventing high frequency video feedthrough to the gate electrode $G_{1a}$ of the reference register 12a. In the absence of this capacitor, signal could be coupled from the input signal source $V_{IN}$ via output terminal 118 of the current mirror amplifier to common gate electrode connection 113 to output terminal 116 of the current mirror amplifier and thence to the gate electrode $G_{1a}$.

The table below gives some typical examples of transistor dimensions and current levels in the circuit of FIG. 12. It is to be understood that these are intended as examples only as other designs are possible.

| Transistor | Channel Width (Mils) | Channel Length (Mils) | Current (mA) |
|---|---|---|---|
| 101 | 0.4 | 2 | |
| 102 | 1 | 0.3 | $i_2$ = 0.24 |
| 103 | 0.4 | 2 | |
| 104 | 1 | 0.3 | $i_4$ = 0.24 |
| 105 | 0.4 | 2 | |
| 106 | 1 | 0.3 | $i_6$ = 0.2 |
| 107 | 2 | 0.3 | |
| 108 | 0.4 | 2 | $i_8$ = 0.01 |
| 109 | 2 | 0.3 | |
| 110 | 0.4 | 2 | $i_{10}$ = 0.01 |
| 111 | 0.4 | 2 | |
| 112 | 1 | 0.3 | $i_{12}$ = 0.1 |

Figure 13:
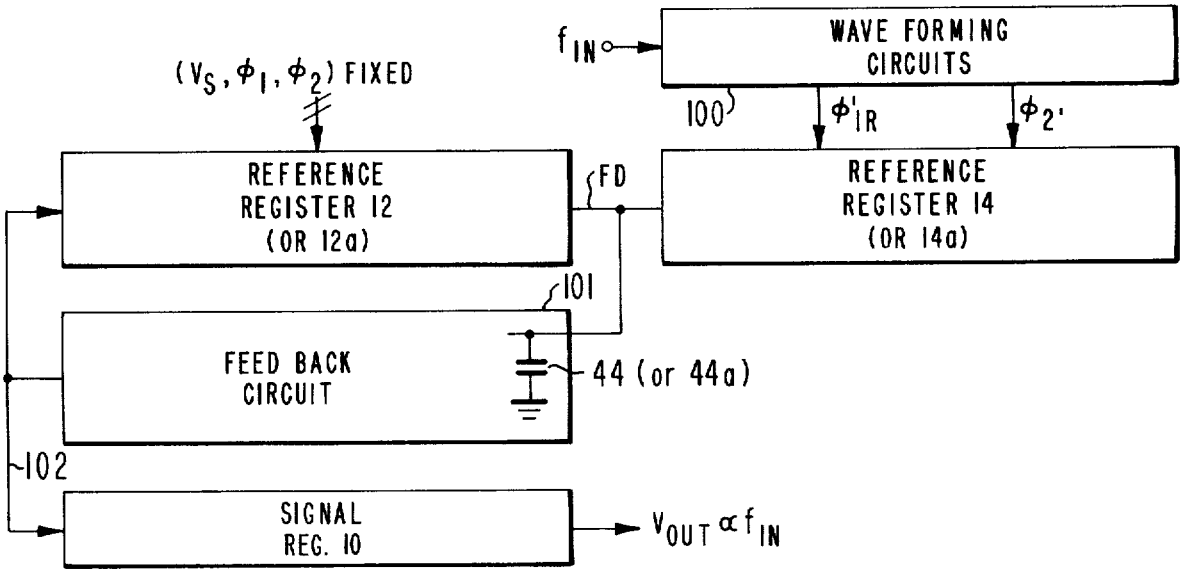
FIG. 13 is a block diagram of another embodiment of the invention.

In the various embodiments of the invention discussed so far, reference register 14 operates synchronously with reference register 12. In other words, all of the operating voltages $V_S$, $\phi_1$, $\phi_2$ and $\phi_{1R}$ are at the same frequency. In addition, the controllable amount of charge produced by register 12 is shifted to the floating diffusion FD during first spaced time intervals and the fixed amounts of charge are removed from the floating diffusion by the reference register 14 during spaced second time intervals which are interleaved with the first spaced time intervals. FIG. 13 illustrates an embodiment of the invention suitable for use as a frequency discriminator in which reference register 12 (or 12a) operates nonsynchronously with reference register 14 (or 14a).

In the operation of the circuit of FIG. 13, reference register 12 operates at a fixed frequency, that is, the various operating voltages $V_S$, $\phi_1$ and $\phi_2$ are the same and remain fixed. An incoming signal at a frequency $f_{IN}$ applied to wave forming circuits 100 causes these circuits to produce the drive voltages $\phi_{1R}'$ and $\phi_2'$ for reference register 14 (or 14a). The voltage $\phi_{1R}'$ is applied to the same electrodes, such as 32 and 34, as the voltage $\phi_{1R}$ is applied in FIG. 1. The voltage $\phi_2'$ is applied to the electrode, such as 36, to which the voltage $\phi_2$ is applied in FIG. 1. $\phi_{1R}'$ and $\phi_2'$ have the same relationship to one another as do the voltages $\phi_{1R}$ and $\phi_2$ in FIG. 2 or the voltages $\phi_{1R}$ and $\phi_2$ in FIG. 9, depending upon whether registers 12 and 14 or 12a and 14a are being employed. However, the frequency of these waves is dependent on the frequency $f_{IN}$ of the input signal. This signal may, for example, be a train of pulses at a pulse repetition frequency $f_{IN}$.

The principle of operation of the circuit of FIG. 13 is similar to that which has already been given. The reference register 12 (or 12a) supplies controllable amounts of charge to the floating diffusion during spaced first time intervals. The reference register 14 (or 14a) removes a fixed amount of charge from the floating diffusion during spaced second time intervals. These second time intervals generally are not interleaved with the first time intervals. The amount of charge removed from the floating diffusion during a given interval of time $\Delta T$ will depend upon the frequency $f_{IN}$ of the input signal, that is, the higher the frequency, the more charge removed.

The feedback circuit 101 may be any one of those previously illustrated and includes an integrating capacitor 44 (or 44a) which is illustrated within block 100. The feedback circuit controls the voltage fed back to electrode $G_{1a}$ of the reference register 12 (or 12a) to be at a level such that the controllable amount of charge supplied to the floating diffusion during a given interval $\Delta T$ becomes equal to the fixed amount of charge removed from the floating diffusion during this same interval $\Delta T$ (assuming $\Delta T$ to encompass a reasonable number of periods of $f_{IN}$). At the same time the feedback circuit supplies a bias voltage over lead 102 to the signal register 10. Thus, the signal register produces an amount of bias charge during each clock period which is proportional to the frequency $f_{IN}$ of the input signal to the wave forming circuits 100. In the present circuit the signal register 10 does not receive input signal (such as $V_{IN}$ of FIG. 1) but receives only the bias signal supplied over lead 102. The output voltage $V_{OUT}$ is therefore a measure of the input signal frequency $f_{IN}$ and may be detected and/or employed for frequency control purposes.

Figure 14:
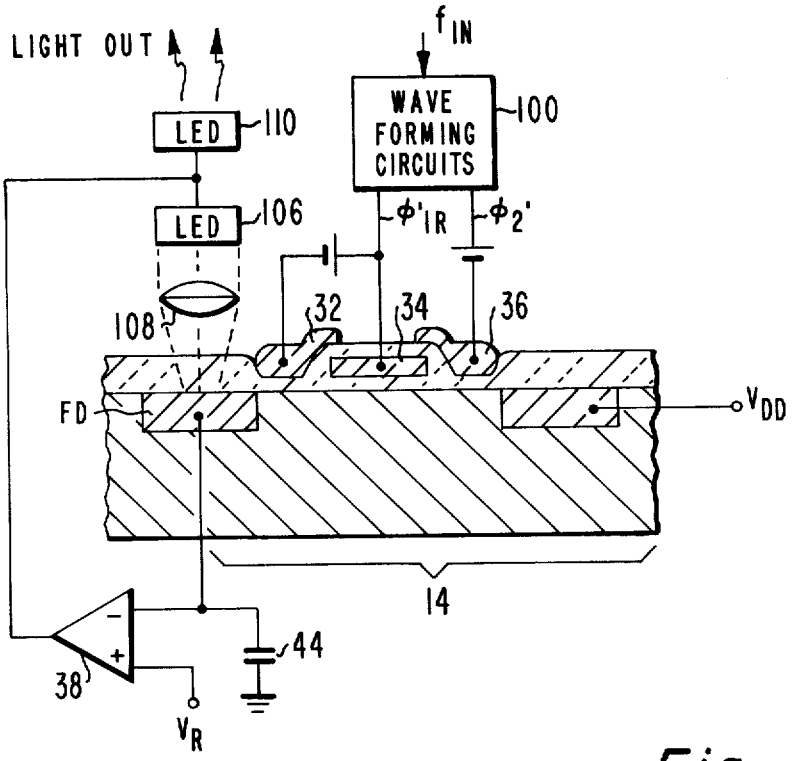
FIGS. 14–16 are block and schematic diagrams showing embodiments of the invention in which radiation, such as light, serves as an input to the system.

FIG. 14 illustrates yet another embodiment of the invention. Here, the first reference register 12 has degenerated to simply the floating diffusion FD. The second reference generator 14 is the same as that employed previously. For the sake of generality, this embodiment has been illustrated as a surface channel device.

The feedback circuit including capacitor 44 and differential amplifier 38 supplies its output to light-emitting diode 106. The latter projects its light either directly or by means of an optical system illustrated schematically at 108 onto the floating diffusion FD. The sense of the connection is such that the charge carriers generated when the photons strike the floating diffusion become equal in number to the number removed from the floating diffusion by the second reference register 14 so that an equilibrium condition is established in the same manner as in the previous embodiments. With the circuit arranged similarly to FIG. 13, that is, with an input signal $f_{IN}$ which for purposes of the present discussion can be assumed to be a frequency modulated signal, the light produced by the light-emitting diode 106 will be amplitude modulated. A second light-emitting diode 110 may be employed for producing an amplitude modulated light output corresponding to the frequency modulated electrical input to the wave forming circuits 100.

Figure 15:
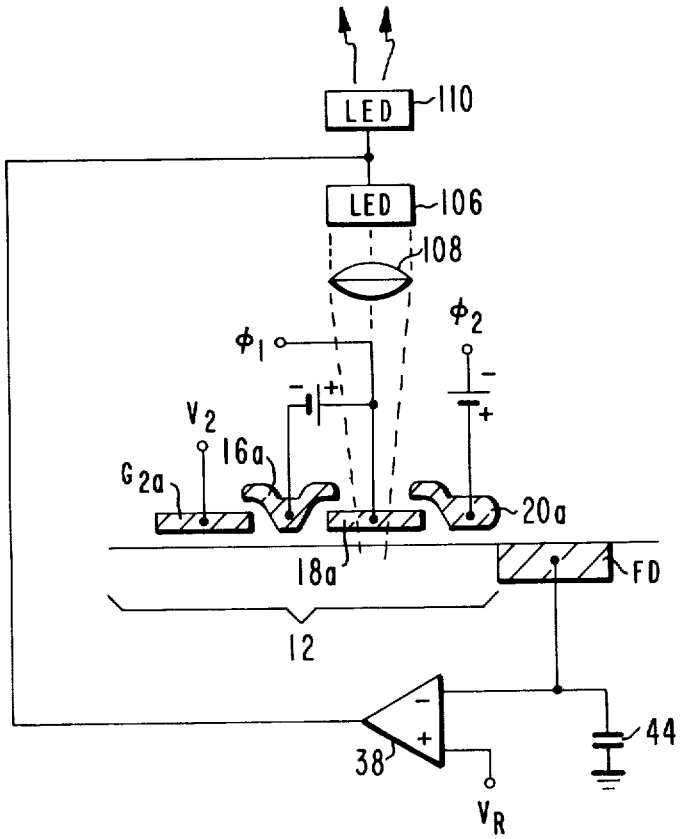

FIG. 15 illustrates a modification of the circuit of FIG. 14. Here, the light-emitting diode illuminates the substrate region beneath $\phi_1$ electrode 18a of the first reference register 12, only a portion of which is illustrated. The carriers thereby generated in the substrate add to the carriers introduced by the source electrode $S_1$ (not shown) and shifted to the potential well beneath electrode 18a by the $\phi_1$ voltage. The remainder of the circuit while not illustrated in FIG. 15, is similar to the circuit of FIG. 14 and includes the second reference generator 14, the wave forming circuits 100 and so on. The operation is similar to that of the circuit of FIG. 14 in that the first reference register supplies to the floating diffusion a number of charge carriers equal to that removed by the second reference register as already discussed.

Figure 16:
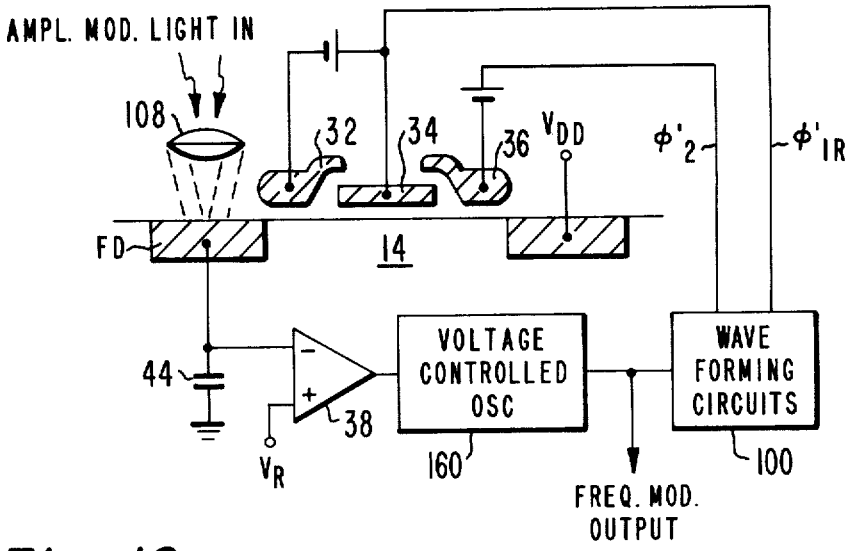

Another form of system is shown in FIG. 16, this one for producing a frequency modulated output in response to an amplitude modulated light input. The amplitude modulated light input is applied through optical system 108 to the floating diffusion. The first reference register 12 is absent. The second reference register 14 is present and shown schematically. The differential amplifier 38 supplies its signal to a voltage controlled oscillator 160 which produces a signal at an output frequency determined by the voltage produced by the differential amplifier. This signal controls the wave forming circuits 100 which produce the $\phi'_{1R}$ and $\phi'_2$ driving voltages for the second reference register 14. These voltages are at frequencies such that the second reference register 14 removes from the floating diffusion FD an amount of charge equal to that supplied to the floating diffusion in response to the amplitude modulated light input. It can be seen that the output frequency of the voltage controlled oscillator, which is the output of the system, is frequency-modulated in correspondence with the amplitude-modulation of the input light to the system. The system of FIG. 16, in other words, is an amplitude-modulated signal-to-frequency-modulated signal converter, the input signal being in the form of light or other radiation to which the floating diffusion is sensitive.

In the various embodiments of the invention which have been discussed which employ a first reference register 12, this register is stated to be essentially identical in physical and electrical characteristics to the input end of the signal register 10. In terms of channel widths, the width $W_{12}$ of the channel of register 12 is equal to the width $W_{10}$ of signal register 10. The width of reference register 14 is made to be of a value such that the proper reference charge $Q_{REF}$ is generated. The size of this reference charge determines the level at which the signal register is DC biased. In one of the examples discussed, the width of the channel in register 14 is made half that of the channel of register 12. Operated in this way, the signal register is biased close to the center of its linear operating region. In mathematical terms:

$$W_{14}=\tfrac{1}{2}W_{12}=\tfrac{1}{4}W_{10} \quad (1)$$

The above is not essential to the invention. Other channel width proportions can be employed to achieve the same effect. For example, the same effect as just discussed can be obtained if the channel width of signal register 10 is made equal to that of reference register 14, provided that the width of channel 12 is made double that of channels 10 and 14. In mathematical terms:

$$W_{14}=W_{10}=W_{12}/2 \quad (2)$$

In other words, with this relationship among channel widths, the signal register 10 will again be biased at about the center of its linear operating region as shown in FIG. 3, operating point 50.

In general terms, the bias charge $Q_B$ supplied to the signal register 10, may be defined as follows:

$$Q_B=Q_{REF}\times(W_{10}/W_{12}) \quad (3)$$

In terms of a full well $Q_F$, that is, the charge which would be present at saturation (FIG. 3) of the signal register 10

$$Q_{REF}=(W_{14}/W_{10})\times Q_F \quad (4)$$

Substituting equation 4 into equation 3 gives the general expression for the relative widths of the channels of registers 14 and 12 in terms of the full well charge as follows:

$$Q_B=(W_{14}/W_{12})\times Q_F \quad (5)$$

Equation (5) may be used by the designer to calculate relative channel widths for any desired bias charge level. For example, to obtain a bias charge $Q_B$ which is $\frac{1}{3}$ of a full well charge, the ratio of $W_{14}/W_{12}$ should be $\frac{1}{3}$ and is independent of $W_{10}$. (However, it is often desirable to make $W_{10}$ of the same dimensions as $W_{12}$ for other reasons.)

Figure 17:
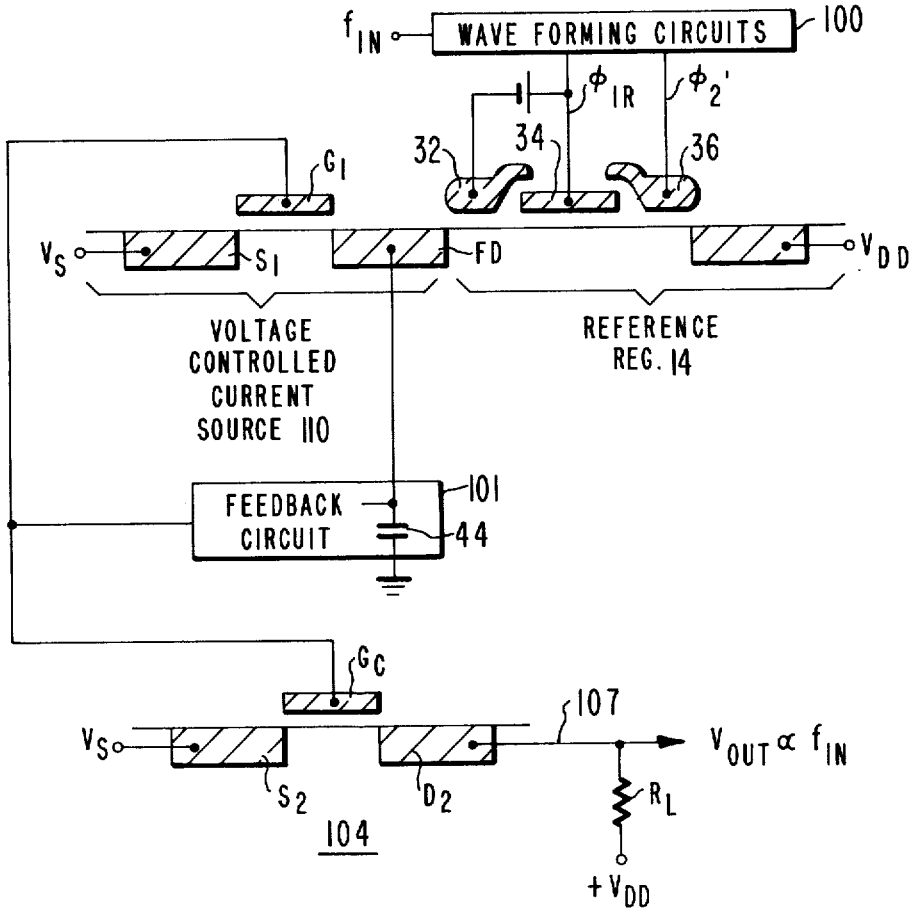
FIG. 17 is a block and schematic showing of another embodiment of the invention.

In a number of embodiments of the invention described so far, the floating diffusion FD receives charge during discrete spaced time intervals. In the embodiment of FIG. 17 the floating diffusion receives charge continuously. In other respects, the operation is similar to that of the frequency discriminator shown in FIG. 13. The difference between the circuit of FIG. 13 and that of FIG. 17 is that in the latter, a voltage controlled current source 110 is substituted for the first reference register. This current source comprises a transistor having a source electrode $S_1$ corresponding to the source of the CCD, a gate electrode $G_1$ and a drain electrode comprising the floating diffusion FD. The feedback circuit 101 controls the voltage applied to the gate electrode $G_1$ and in this way controls the current continuously supplied to the floating diffusion. The second reference register, which is illustrated here as a surface channel CCD 14, removes charge during spaced intervals recurring at a period corresponding to the frequency $f_{IN}$ of the signal applied to the wave forming circuits 100. Here as in FIG. 13, the integrating capacitor such as 44 in the feedback circuit is specifically illustrated as it is desired that such a capacitance be present to integrate the charge at the floating diffusion.

The circuit 104 comprises the output transistor $S_2$, $D_2$, $G_c$ of a current mirror amplifier. The input transistor is current source 110 and the gate electrode-to-drain electrode connection of this input transistor comprises feedback circuit 101. The output current of the current mirror, available at lead 107, mirrors the current supplied to the floating diffusion FD. This current is translated to a voltage $V_{OUT}$ across resistor $R_1$, where $V_{OUT}\propto f_{IN}$.

While the circuit of FIG. 17 is shown embodied in the surface channel CCD, it can instead be formed of a buried channel CCD similar to those illustrated in other of the figures.

What is claimed is:

1. In a charge-coupled circuit which includes a semiconductor substrate of given conductivity type, a plurality of electrode means insulated from the substrate responsive to applied voltages for the storage and propagation of charge in said substrate, and an electrically floating region in the substrate of different conductivity type than the substrate, in combination:

means for supplying a controllable amount of charge to said region *in accordance with a continuous function of the level of a direct voltage applied thereto*;

means including a number of said electrode means for removing from said region, during each of a plurality of spaced time intervals, a fixed quantity of charge, that is, an amount of charge which is of substantially the same magnitude from one time interval to the next; and feedback circuit means for adjusting the controllable amount of charge supplied to said region to be equal to the charge removed from that region so as to tend to maintain said floating region at a relatively constant average voltage level, said feedback circuit means including means responsive *solely* to said average voltage level at said floating region for applying [a] *said* direct voltage bias at a level proportional to said average voltage level to said means for supplying a controllable amount of charge.

2. In a charge-coupled circuit as set forth in claim 1, said means for supplying a controllable amount of charge comprising:

a source of charge carriers in said substrate; and at least one of said electrode means adjacent to said source and responsive to said feedback circuit means for controlling the amount of charge supplied by said source.

3. In a charge-coupled circuit as set forth in claim 1, said means for supplying a controllable amount of charge to said floating region comprising means for causing a flow of said charge in a continuous stream.

4. In a charge-coupled circuit as set forth in claim 1, said means for supplying a controllable amount of charge to said floating region comprising means for doing so during each of a plurality of spaced, discrete first time intervals.

5. In a charge-coupled circuit as set forth in claim 4, said means for supplying a controllable amount of charge to said region comprising:

a source of charge carriers in said substrate; and one of said electrode means, *hereafter termed a gate electrode,* adjacent to said source responsive to said feedback circuit means for controlling the amount of charge introduced by said source, and a further one of said electrode means for propagating said *introduced* charge to said floating region.

6. In a charge-coupled circuit as set forth in claim 5, further including:

a charge-coupled device signal register having a source electrode for introducing charge, and one of said electrode means, hereafter termed a *second* gate electrode, for controlling the amount of said charge introduced by said source electrode *in accordance with the level of a voltage bias applied to said second gate electrode*;

an input signal terminal for receiving a signal potential coupled to said *second* gate electrode [of said signal register]; and means receptive of an output of said feedback circuit means for applying [a] *said* direct voltage bias exclusive of said signal potential to said *second* gate electrode [of said signal register] *at a level proportional to said average voltage level.*

7. In a charge-coupled circuit as set forth in claim 6, said means for applying a direct voltage bias to said *second* gate electrode [of said signal register] comprising means for doing so at a level to cause a bias charge to be introduced by the source electrode of said signal register which is equal to the amount of charge introduced by the first mentioned source of charge carriers.

8. In a charge-coupled circuit as set forth in claim 5, said feedback circuit means comprising a differential amplifier having two input terminals, one of which is coupled to said floating region, integrating means coupled to said floating region for integrating the voltage applied to said one input terminal, means for applying a voltage at a reference level to the other of said input terminals, and said differential amplifier having an output terminal connected to said gate electrode for supplying a direct voltage bias thereto.

9. In a charge-coupled circuit as set forth in claim 4, said feedback circuit means comprising a level shifter, that is, a circuit for translating the average voltage level at said floating region to a direct voltage bias at a different voltage level.

10. In a charge-coupled circuit as set forth in claim 4, said means for removing a fixed quantity of charge from said region comprising means for removing said charge during second time intervals interleaved with the spaced first time intervals.

11. In a charge-coupled circuit as set forth in claim 1, said means for supplying a controllable amount of charge to said floating region comprising a source of light.

12. In a charge-coupled circuit as set forth in claim 1, further including current mirror amplifier means having an input terminal, an output terminal and a common terminal, said feedback circuit supplying an input signal to said input terminal.

13. In a charge-coupled device (CCD) circuit which includes a semiconductor substrate of given conductivity type in which charges may be stored and propagated in response to voltages applied to electrodes which are insulated from the substrate, and which includes an electrically floating region in the substrate of different conductivity type [than] *from* the substrate, in combination:

a first CCD register integrated into said substrate, including a plurality of said electrodes, for shifting charge into said floating region during each of a plurality of first time intervals;

a second CCD register integrated into said substrate, including a plurality of said electrodes, for removing a fixed quantity of charge, that is, a quantity whose value is substantially [contant] *constant*-constant, from said floating region during each of a plurality of spaced second time intervals, each second time interval occurring during a period of time that charge is present in said region and prior to the shifting into said region during the following first time interval of another controllable amount of charge; and a negative feedback circuit including means for integrating the voltage present at said floating region, and means responsive to *solely the level of* said integrated voltage for supplying a direct voltage bias level to said first CCD register for controlling, *in accordance with a continuous function of the integrated voltage level,* the amount of charge shifted by said first CCD register into said floating region during each first interval to be equal to said fixed quantity of charge removed from said floating region by said second CCD register during each second interval.

14. In a charge-coupled device circuit as set forth in claim 13, further including:

a third CCD register having a signal input circuit which includes one of said electrodes, hereafter termed an input electrode responsive to an input signal for introducing a signal charge into said third CCD register; and means responsive to said feedback circuit for applying a direct voltage bias to said input electrode for introducing [a] *an amount of* bias charge, *in accordance with a continuous function of the integrated voltage level,* into said third CCD register concurrently with the introduction of said signal charge.

15. A charge-coupled circuit as set forth in claim 14 wherein said first CCD register including an input circuit which is substantially identical to that of said third CCD register.

16. A charge-coupled circuit as set forth in claim 15, wherein said first and third CCD registers include input circuits of the fill and spill type, each such circuit comprising:

means including at least one of said electrodes, hereafter termed a storage electrode, providing a storage potential well in said substrate, a second region in the substrate of different conductivity type than the substrate, and an input one of said electrodes located between said second region and said storage electrode for controlling the flow of charge between said second region and said storage potential well, means for operating said second region as a source of charge carriers to fill said storage potential well with charge, and means for operating said second region as a drain for charge carriers to remove some of the charge carriers from said storage potential well to leave in said storage potential well an amount of charge dependent on the difference in potential between said input and said storage electrodes.

17. A charge-coupled circuit as set forth in claim 16, wherein each input circuit comprises:

a diffusion in the substrate of opposite conductivity than the substrate, and first and second of said electrodes insulated from the substrate, the first electrode adjacent to the diffusion and between it and the second electrode, said input signal being applied to the first electrode of said third CCD register; and wherein:

said means responsive to said feedback circuit comprising means for applying said direct voltage bias to said first electrode of said third CCD register, and said means for controlling the amount of charge shifted by said first CCD register into said floating region comprising means for applying said direct voltage bias to said first electrode of said first CCD register.

18. A charge-coupled circuit as set forth in claim 17, wherein the input circuits of said first and third CCD registers each further includes, a third one of said electrodes adjacent to said second electrode, means for shifting charge from the substrate region beneath said second electrode via the substrate region beneath said third electrode, and means for controlling the potential of said third electrode during the shifting of said charge from the substrate region beneath said second electrode so that there remains behind in the substrate region beneath said second electrode, a fixed amount of charge.

19. In a charge-coupled device (CCD) which includes a substrate, a source of charge carriers in said substrate, a storage electrode insulated from the substrate close to said source of charge carriers, electrodes insulated from the substrate responsive to applied voltages for storing and propagating charges in said substrate, means including one of said electrodes responsive to an input signal whose value may vary for transferring from said source of charge carriers to the substrate region beneath said storage electrode an amount of charge dependent upon the amplitude of said input signal, and means including one of said electrodes responsive to a direct voltage at a reference level for transferring from said source of charge carriers to said substrate region a bias charge, the improvement comprising:

negative feedback means, including means for translating said direct voltage level into a reference charge of a magnitude [proportional to] *that is a linear function solely of* said direct voltage level, and means for sensing a change in the value of said reference charge which tends to occur when the amplitude of said direct voltage reference level tends to change, for automatically returning said direct voltage level to said reference level to thereby maintain the level of said bias charge substantially constant.

20. In a charge-coupled device (CCD) which includes a substrate, a source of charge carriers in said substrate, a storage electrode insulated from the substrate close to said source of charge carriers, electrodes insulated from the substrate responsive to applied voltages for storing and propagating charges in said substrate, means including one of said electrodes responsive to an input signal whose value may vary for transferring from said source of charge carriers to the substrate region beneath said storage electrode an amount of charge dependent upon the amplitude of said input signal, and means including one of said electrodes responsive to a direct voltage at a reference level for transferring from said source of charge carriers to said substrate region a bias charge, the improvement comprising:

a CCD reference register including a substrate, a source of charge carriers in said substrate, a storage electrode insulated from said substrate close to said source of said CCD reference register, means responsive to said direct voltage at said reference level for transferring from said source of said CCD reference register to the substrate region beneath said storage electrode of said CCD reference register a controlled amount of charge *that is a continuous function of the value of said direct voltage*, and means responsive *solely* to the level of said controlled amount of charge for maintaining the value of said direct voltage at said reference level.

21. A charge-coupled device as set forth in claim 20 wherein said means responsive to the level of said controlled amount of charge comprises means for comparing that level with a reference charge level.

22. A charge-coupled device as set forth in claim 21 wherein said means responsive to the level of said controlled amount of charge further comprises a negative feedback circuit.

23. In a charge-coupled device (CCD) which includes a semiconductor substrate of given conductivity type, and electrodes insulated from the substrate responsive to applied voltages for storing and propagating charge in the substrate, in combination:

an electrically floating region in the substrate of different conductivity type than the substrate;

input means for supplying charge to said region;

output means for removing charge from said region; [and]

adjusting means for adjusting one of said input an output means *in accordance with a continuous function of the level of a direct voltage bias supplied thereto*, for causing the amount of charge supplied to said region by said input means to be equal to the *amount of* charge removed from that region by said output means so as to tend to maintain said floating region at a relatively constant average voltage level, said adjusting means including means for integrating the voltage present at said floating region and means responsive *solely* to *the level of* said integrated voltage, for [supplying a] *applying said* direct voltage bias to said one of said input and output means;

*a charge-coupled device signal register having a source electrode and a gate electrode for controlling the amount of charge introduced by said source electrode;*

*an input signal terminal coupled to said gate electrode of said signal register; and*

*means receptive of said direct voltage bias produced by said adjusting means for applying the same to said gate electrode of said signal register.*

24. A CCD as set forth in claim 23, wherein said adjusting means comprises a negative feedback circuit having an input connected to said region and an output circuit connected to one of said input and output means.

25. In a CCD as set forth in claim 23, said output means comprising means removing substantially equal quantities of charge from said region during each of a plurality of successive, equal duration time intervals.

26. In a CCD as set forth in claim 23, each of said input and output means being capable of passing an amount of charge whose value may vary during successive equal duration time intervals.

27. A CCD as set forth in claim 24, wherein said input means comprises:

a source of charge in said substrate; and gate electrode means adjacent to said source and responsive to said feedback circuit means for controlling the amount of charge supplied by said source.

[28. A CCD as set forth in claim 23, and further including:

a charge-coupled device signal register having a source electrode, and a gate electrode for controlling the amount of charge introduced by said source electrode;

an input signal terminal coupled to said gate electrode of said signal register; and means receptive of said direct voltage bias produced by said adjusting means for applying the same to said gate electrode of said signal register.]

29. A CCD as set forth in claim 24, wherein said negative feedback circuit comprises a differential amplifier having two input terminals, one of which is coupled to said means for integrating, means for applying a voltage at a reference level to the other of said input terminals, and said differential amplifier having an output terminal connected to said gate electrode for supplying a direct voltage bias thereto.

30. A CCD as set forth in claim 24, wherein said integrating means comprises an integrating capacitor connected between said floating region and a point of reference potential.

* * * * *